United States Patent
Matsuda

(10) Patent No.: US 8,043,912 B2
(45) Date of Patent: Oct. 25, 2011

(54) MANUFACTURING METHOD OF A SEMICONDUCTOR DEVICE HAVING POLYCIDE WIRING LAYER

(75) Inventor: Satoshi Matsuda, Oita (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 488 days.

(21) Appl. No.: 11/976,515

(22) Filed: Oct. 25, 2007

(65) Prior Publication Data

US 2008/0057642 A1    Mar. 6, 2008

Related U.S. Application Data

(62) Division of application No. 11/226,465, filed on Sep. 15, 2006, now abandoned.

(30) Foreign Application Priority Data

Sep. 17, 2004 (JP) .................................. 2004-272336

(51) Int. Cl.
*C23C 16/42* (2006.01)
*H01L 21/8242* (2006.01)

(52) U.S. Cl. ........ 438/243; 438/210; 438/221; 438/230; 438/238; 438/296; 438/581; 438/583; 438/655; 257/68; 257/71; 257/73; 257/202; 257/296; 257/301; 257/365; 257/412; 257/413; 257/E27.084; 257/E21.646

(58) Field of Classification Search ........ 438/FOR. 208, 438/197, 210–211, 218, 221, 230, 238, 243, 438/257, 279, 296, 386, 581, 583, 630, 649, 438/655, 664, 682; 257/68, 71, E27.084, 257/E21.646, 905–908, 73, 202, 208–211, 257/213, 288, 296, 301, 327, 365, 388, 412–413, 257/454–456, 755, 768–770, E21.396
See application file for complete search history.

(56) References Cited

U.S. PATENT DOCUMENTS

| | | | | | |
|---|---|---|---|---|---|
| 5,686,746 | A | * | 11/1997 | Iwasa | 257/296 |
| 5,798,545 | A | * | 8/1998 | Iwasa et al. | 257/301 |
| 6,040,606 | A | | 3/2000 | Blair | |
| 6,323,082 | B1 | * | 11/2001 | Furukawa et al. | 438/247 |

(Continued)

FOREIGN PATENT DOCUMENTS

JP    8-241988 A    9/1996

(Continued)

OTHER PUBLICATIONS

N. Yanagiya et al., "65nm CMOS Technology (CMOS5) with High Density Embedded Memories for Broadband Microprocessor Applications", IEDM Tech Digest, 2002.

(Continued)

*Primary Examiner* — Matthew Landau
*Assistant Examiner* — Maliheh Malek
(74) *Attorney, Agent, or Firm* — Foley & Lardner LLP

(57) ABSTRACT

A semiconductor device is provided with a semiconductor substrate comprising element isolation regions and an element region surrounded by the element isolation regions, a first polysilicon layer formed in the element region of the semiconductor substrate, an element-isolating insulation film formed in the element isolation region of the semiconductor substrate, a second polysilicon layer formed on the element-isolating insulation film, a first silicide layer formed on the first polysilicon layer. And the device further comprising a second silicide layer formed on the second polysilicon layer and being thicker than the first silicide layer.

3 Claims, 11 Drawing Sheets

U.S. PATENT DOCUMENTS

| | | | |
|---|---|---|---|
| 6,630,721 B1 | 10/2003 | Ligon | |
| 2004/0004257 A1 | 1/2004 | Lee et al. | |
| 2004/0029348 A1* | 2/2004 | Lee | 438/299 |
| 2004/0183111 A1* | 9/2004 | Shinkawata | 257/296 |
| 2005/0042831 A1 | 2/2005 | Mehrotra | |
| 2005/0077563 A1 | 4/2005 | Alsmeier | |
| 2006/0076603 A1* | 4/2006 | Matsuda | 257/301 |
| 2007/0069267 A1* | 3/2007 | Matsuda | 257/301 |

FOREIGN PATENT DOCUMENTS

| | | |
|---|---|---|
| JP | 2003-100748 A | 4/2003 |

OTHER PUBLICATIONS

Y. Matsubara et al., "Fully Compatible Integration of High Density Embedded DRAM with 65nm CMOS Technology (CMOS5)", IEDM Tech Digest, 2002.

* cited by examiner

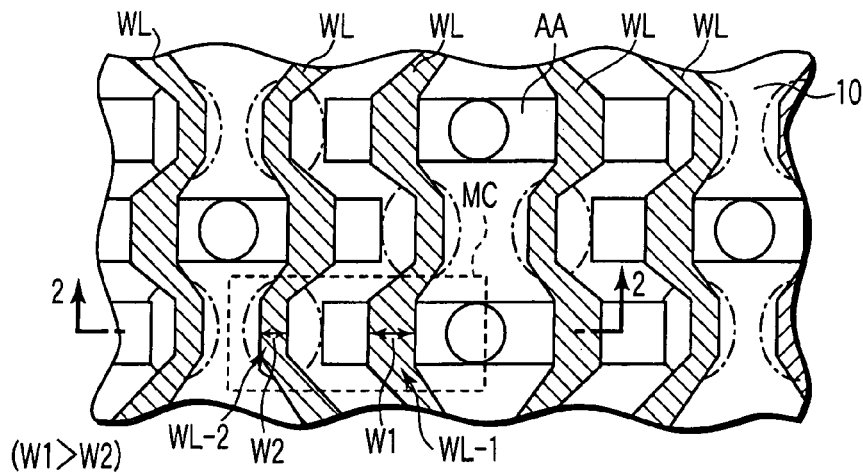
F I G. 1
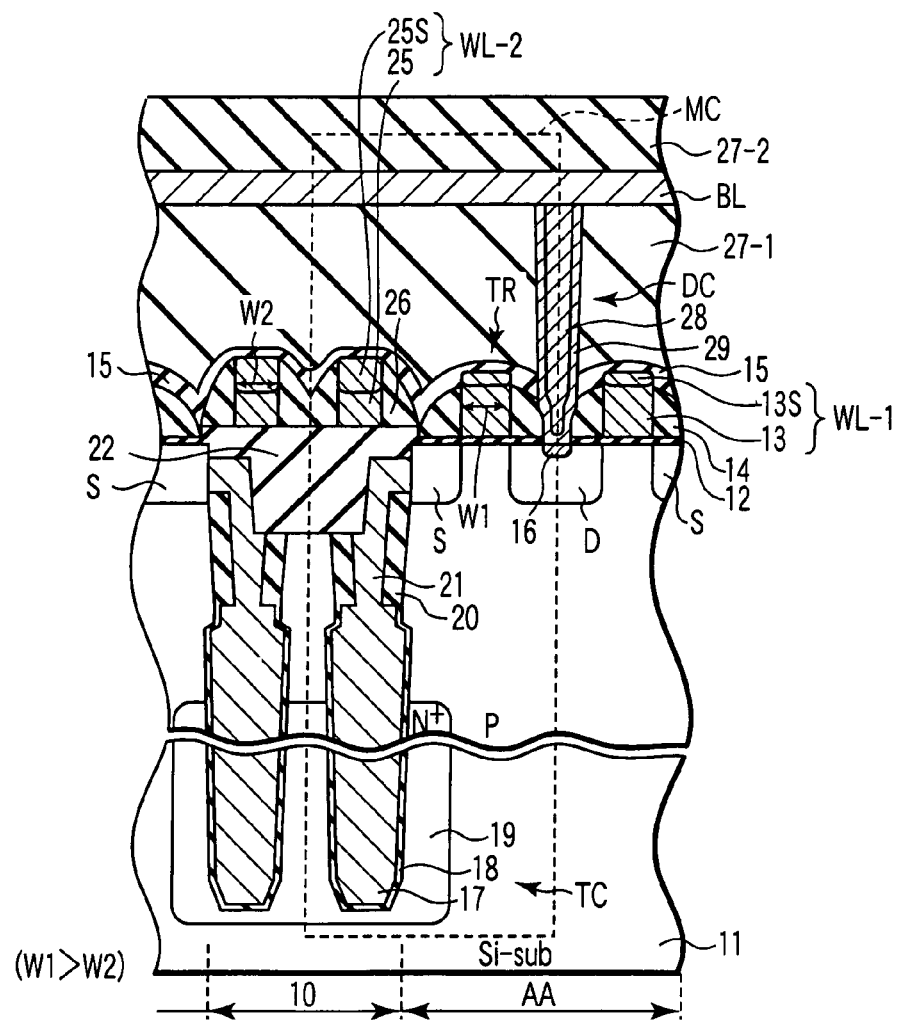
F I G. 2

(W1>W2)

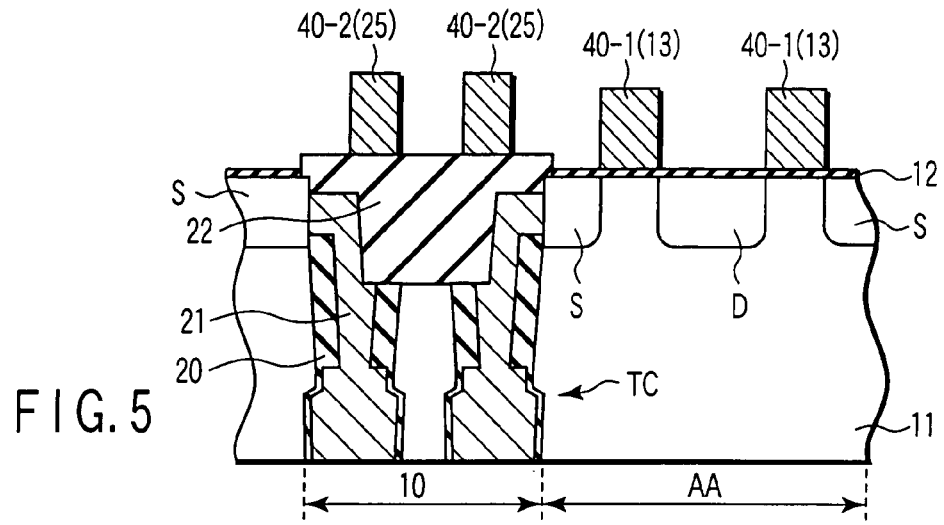
F I G. 5
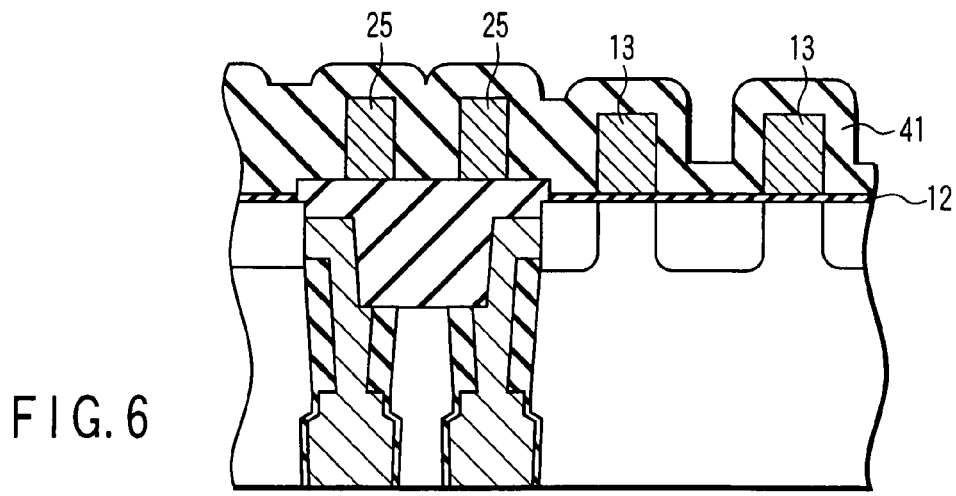
F I G. 6
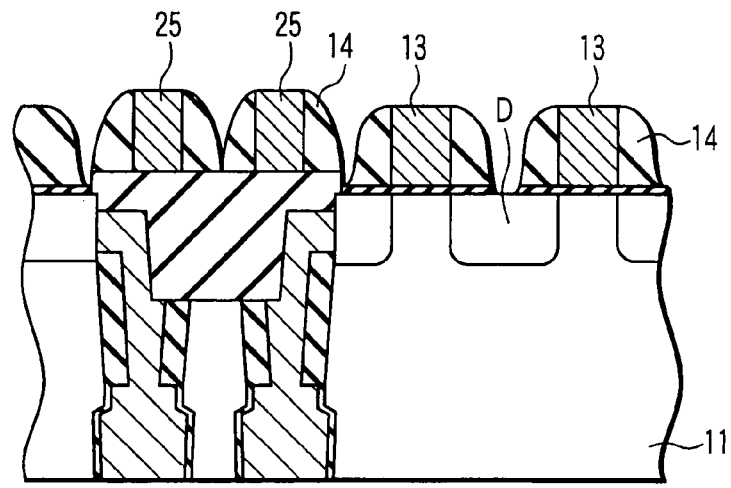
F I G. 7

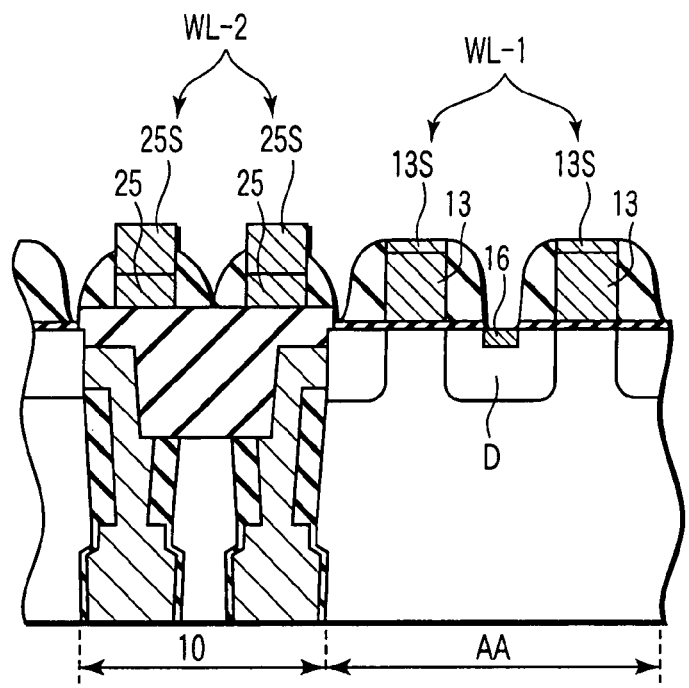
F I G. 16
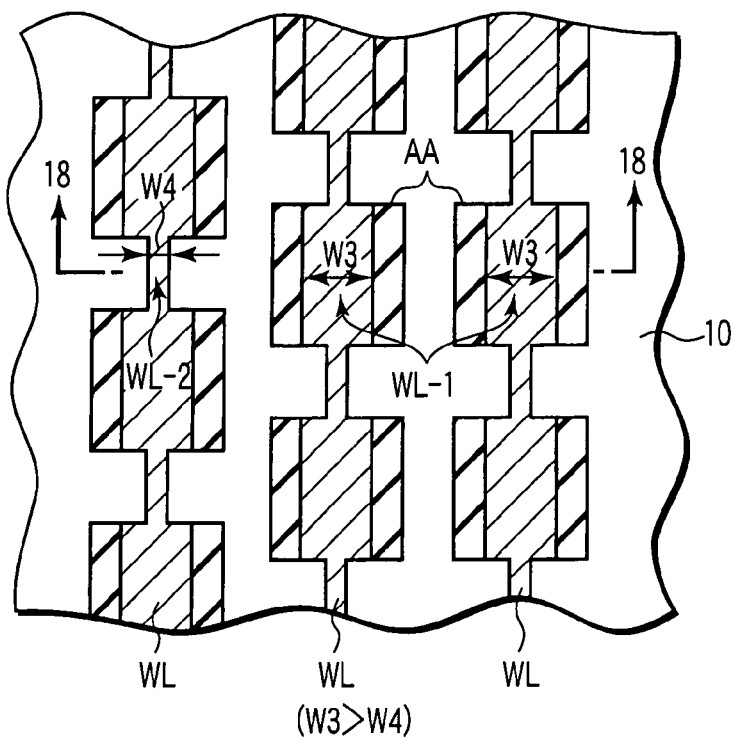
F I G. 17

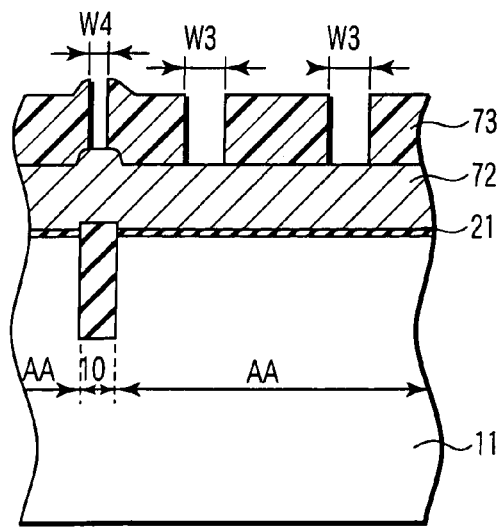
F I G. 20
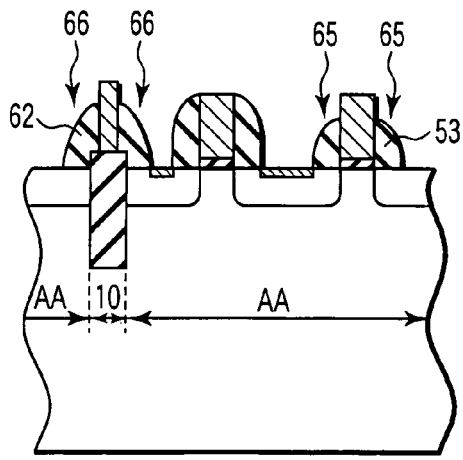
F I G. 22
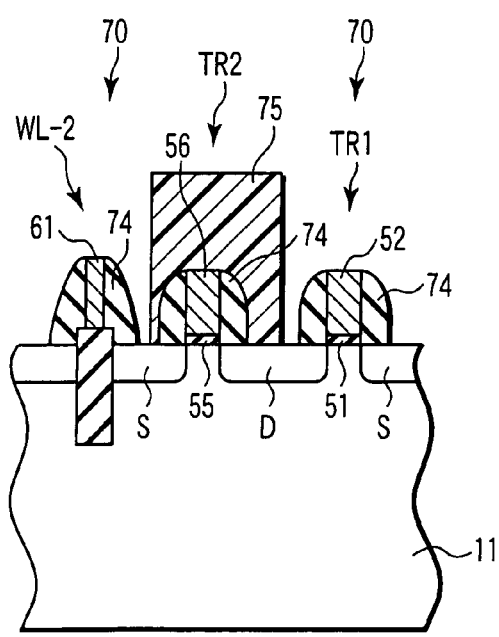
F I G. 21

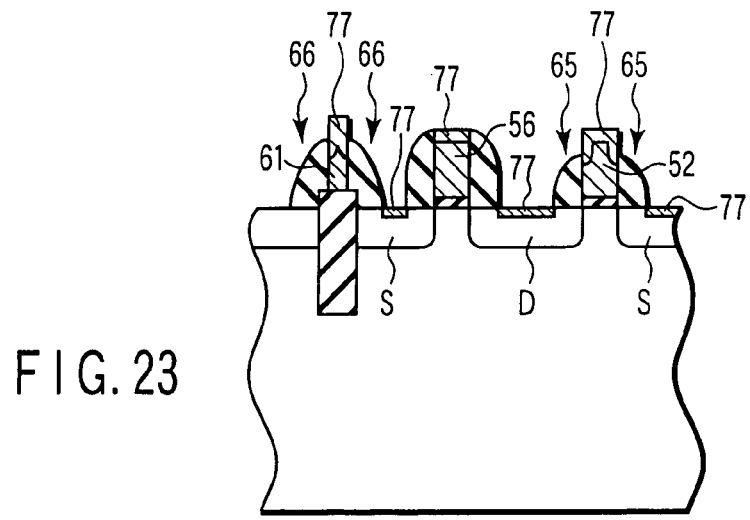
F I G. 23
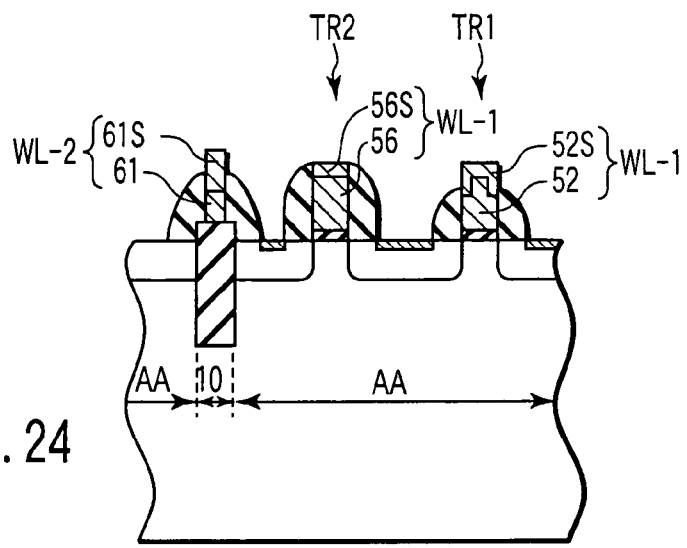
F I G. 24
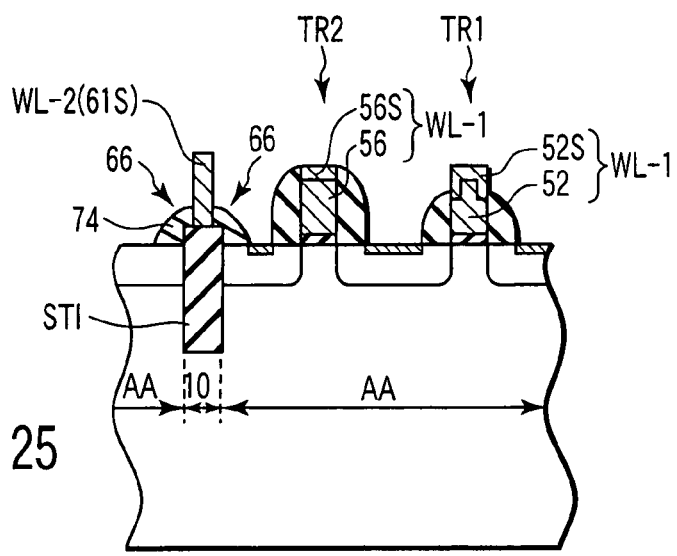
F I G. 25

MANUFACTURING METHOD OF A SEMICONDUCTOR DEVICE HAVING POLYCIDE WIRING LAYER

CROSS-REFERENCE TO RELATED APPLICATIONS

The present application is a divisional of U.S. application Ser. No. 11/226,465, the entire contents of which are incorporated herein by reference.

This application is based upon and claims the benefit of priority from prior Japanese Patent Application No. 2004-272336, filed Sep. 17, 2004, the entire contents of which are incorporated herein by reference.

BACKGROUND OF THE INVENTION

1. Field of the Invention

The present invention relates to a semiconductor device having a polycide wiring structure, and also to a manufacturing method of the same.

2. Description of the Related Art

A so-called polycide wiring structure is applied to many of the recent semiconductor devices since the structure is suited to high integration. In this polycide wiring structure, a polysilicon layer, which is the same layer as the gate electrode of a memory cell of a DRAM or a logic element, is extended continuously and used as a wiring layer. Compared to a metal wiring structure (wherein an allowance has to be provided between a contact and a gate, between different contacts, and between a contact and a metal layer), the polycide wiring structure is suitably applied to high integration of semiconductor devices since the wiring layer is the same polysilicon layer as the gate electrode and therefore enables small layout patterns. In many cases, the polycide wiring structure is a multi-layered structure wherein a polysilicon layer is overlaid with a silicide layer (refer to Jpn. Pat. Appln. KOKAI Publication No. 2003-100748, for example).

The polycide wiring structure is not advantageously applied to devices requiring high-speed operations, because the polysilicon layer it uses has a higher resistance than that of a metal wiring layer (which is formed of Al or Cu) and therefore causes an increase in the RC delay.

If a thick silicide layer is formed on the polysilicon, the resistance will decrease and a high-speed operation can be expected. However, the thickness of the silicide layer cannot be controlled with high precision when the layer is formed. If the silicide layer is too thick, it may react with the gate insulating film and penetrate the gate insulating film, causing short circuits.

BRIEF SUMMARY OF THE INVENTION

A semiconductor device according to one aspect of the present invention comprises: a semiconductor substrate having element isolation regions and an element region surrounded by the element isolation regions; a first polysilicon layer formed in the element region of the semiconductor substrate; an element-isolating insulation film formed in each of the element isolation regions of the semiconductor substrate; a second polysilicon layer formed on the element-isolating insulation film; a first silicide layer formed on the first polysilicon layer; and a second silicide layer formed on the second polysilicon layer and being thicker than the first silicide layer.

A semiconductor device according to another aspect of the present invention comprises: a semiconductor substrate having element isolation regions and an element region surrounded by the element isolation regions; and a first transistor and a second transistor which are formed in the element region of the semiconductor substrate, each of the first and second transistors comprising: a gate insulation film formed on the semiconductor substrate; a gate electrode formed on the gate insulation film and including a polysilicon layer and a silicide layer; a spacer formed on a side wall of the gate electrode; and impurity diffusion layers separately formed in the semiconductor substrate and surrounding the gate electrode, the spacer of the first transistor being lower in level than the spacer of the second transistor, and the silicide layer of the gate electrode of the first transistor being thicker than the silicide layer of the gate electrode of the second transistor.

A semiconductor device manufacturing method according to a further aspect of the present invention comprises: forming element-isolating insulation films in element isolation regions of a semiconductor substrate; continuously forming a polysilicon layer on the semiconductor substrate such that the polysilicon layer is formed on the element-isolating insulation film and on an element region surrounded by the element-isolating insulation films; introducing impurities into the element region of the semiconductor substrate, using the polysilicon layer as a mask; forming a spacer which is in contact with a side wall of the polysilicon layer; forming a mask layer having an opening in which the spacer in the element isolation region is exposed; etching the spacer, using the mask layer as a mask, such that shoulder portions which are near the spacer in the element isolation region and the polysilicon layer in the element isolation region are exposed; forming a silicide layer on the polysilicon layer by a salicide process and permitting a silicide layer to grow on the exposed shoulder portions of the polysilicon layer such that the silicide layer is thicker in the element isolation region than in the element region.

BRIEF DESCRIPTION OF THE SEVERAL VIEWS OF THE DRAWING

FIG. 1 is a plan view schematically illustrating a semiconductor device according to the first embodiment of the present invention.

FIG. 2 is a sectional view taking along line 2-2 of FIG. 1.

FIG. 5 is a sectional view illustrating a step performed in the semiconductor device manufacturing method related to the first embodiment.

FIG. 6 is a sectional view illustrating a step performed in the semiconductor device manufacturing method related to the first embodiment.

FIG. 7 is a sectional view illustrating a step performed in the semiconductor device manufacturing method related to the first embodiment.

FIG. 16 is a sectional view illustrating a step performed in the semiconductor device manufacturing method related to the second embodiment.

FIG. 17 is a plan view schematically illustrating a semiconductor device according to the third embodiment of the present invention.

FIG. 20 is a sectional view illustrating a step performed in the semiconductor device manufacturing method related to the third embodiment.

FIG. 21 is a sectional view illustrating a step performed in the semiconductor device manufacturing method related to the third embodiment.

FIG. 22 is a sectional view illustrating a step performed in the semiconductor device manufacturing method related to the third embodiment.

FIG. 23 is a sectional view illustrating a step performed in the semiconductor device manufacturing method related to the third embodiment.

FIG. 24 is a sectional view illustrating a step performed in the semiconductor device manufacturing method related to the third embodiment.

FIG. 25 is a sectional view illustrating a step performed in a method for manufacturing a semiconductor device of fully-silicided type.

DETAILED DESCRIPTION OF THE INVENTION

Figure 3:
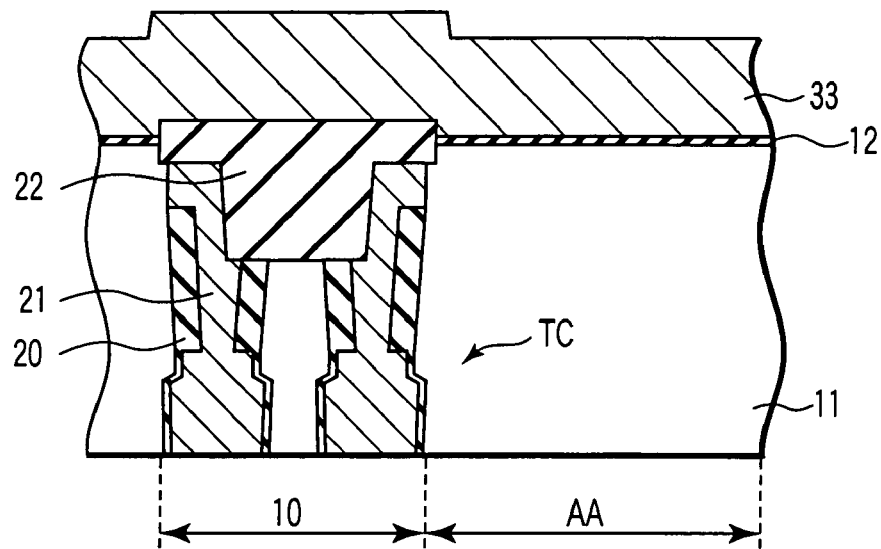
FIG. 3 is a sectional view illustrating a step performed in a semiconductor device manufacturing method related to the first embodiment.

Embodiments of the present invention will now be described with reference to the accompanying drawings. In the descriptions below, the same or corresponding structural elements will be referred to by use of the same reference numerals.

First Embodiment

Trench-Type DRAM

A semiconductor device according to the first embodiment of the present invention and a method for manufacturing the semiconductor device will now be described, referring to FIGS. 1 through 11. In the description of the first embodiment, the semiconductor device is a trench-type DRAM to which a polycide wiring structure is applied.

FIG. 1 is a plan view schematically illustrating a semiconductor device according to the first embodiment of the present invention. FIG. 2 is a sectional view taken along line 2-2 of FIG. 1.

Referring to FIGS. 1 and 2, an active area AA is formed on a P-type silicon substrate 11, and bit lines BL (not shown in FIG. 1) is provided in the active area AA. Word lines WL (conductive layers) are provided in such a manner that they extend in the direction crossing the bit lines BL. Trench-type DRAMs are provided at the intersections between the bit lines BL and the word lines WL. In FIGS. 1 and 2, the area indicated by the broken lines is an area in which a 1-bit memory cell MC is provided. The memory cell MC includes a cell transistor TR and a trench capacitor TC.

The cell transistor TR comprises: a gate insulation film 12 provided in a major surface of the semiconductor substrate 11; a polysilicon layer 13 provided on the gate insulation film 12; a silicide layer 13S provided on the polysilicon 13; a spacer 14 in contact with the side walls of the polysilicon layer 13 and the silicide layer 13S; a source S and a drain D provided in the substrate 11 in such a manner as to sandwich the gate electrode 13; and a liner insulation film 15 formed on both the silicide layer 13S and the spacer 14.

The trench capacitor TC comprises: a storage electrode 17 provided inside a trench formed in the substrate 11; a capacitor insulating film 18 provided at the interface between the side wall of the trench and the storage electrode 17; and a plate electrode 19 provided in the substrate portion opposed to the storage electrode 17.

An electrode 21 is formed in the substrate 11 in such a manner that it is located above the trench capacitor TC. The electrode 21 electrically connects the storage electrode 17 and the source S together. A thick node insulating film 20 is provided inside the substrate 11. An element-isolating insulation film 22, which is a trench top oxide (TOT), is provided on both the node insulating film 20 and the electrode 21.

A drain contact DC is provided in the insulating layer 27-1 in such a manner that it is located above the drain D. The drain contact DC electrically connects the drain D and the bit line BL together. The drain contact DC includes (i) a conductive layer 28 provided inside a trench formed in the insulating layer 27-1 and (ii) a barrier metal layer 29 provided between the conductive layer 28 and the side wall of the trench. An insulating layer 27-2 is formed on the bit line BL.

The word line WL in the active region (element region) AA sandwiched by the element isolation regions 10 serves as a gate electrode WL-1. The word line WL includes: a polysilicon layer (first polysilicon layer) 13 formed on the substrate 11 in the active region AA; and a silicide layer (first silicide layer) 13S formed on the polysilicon layer 13.

The word line WL in the element isolation region 10 serves as a wiring layer WL-2 used for electrical connection. The word line WL includes: a polysilicon layer (second polysilicon layer) 25 formed on the element-isolating insulation film 22 in the element isolation region 10; and a silicide layer (second silicide layer) 25S provided on the polysilicon layer 25. The gate electrode WL-1 is a word line provided in the element region AA, and the wiring layer WL-2 is a password line provided in the element isolation region 10. The silicides 13A and 25S are formed of NiSi, for example.

The spacer 14 is in contact with the side wall of the gate electrode WL-1. Likewise, a spacer 26 is in contact with the side wall of the wiring layer WL-2.

As shown in FIG. 1, the width W1 of the gate electrode WL-1 is greater than the width W2 of the wiring layer WL-2. Furthermore, the thickness of the silicide layer 25S of the wiring layer WL-2 is greater than the thickness of the silicide layer 13S of the gate electrode WL-1.

As described above, the semiconductor device of the present embodiment is a trench-type DRAM to which a polycide wiring structure is applied. The semiconductor device of the present embodiment comprises: a gate-insulated field effect transistor TR provided in the element region AA of the major surface of the semiconductor substrate 11; and silicide layers 13S and 25S extending from the element region AA toward the element isolation regions 10 and provided on the polysilicon layers 13 and 25 and the polysilicon layers 13 and 25. The thickness of the silicide layer 25S is greater in the element isolation region 10 than in the element region AA. The element region AA serves as a gate electrode WL-1 of the gate-insulated field effect transistor W, and the element isolation region 10 includes a conductive layer WL-2 which is of a laminated structure and which serves as a wiring layer.

The semiconductor device of the above embodiment may further comprise a trench capacitor TC located in the neighborhood of the gate-insulated field effect transistor. The trench capacitor TC has an electrode connected to one end of the current path of the gate-insulated field effect transistor, and forms a pair of memory cells in cooperation with the gate-insulated field effect transistor. The conductive layer in the element region is a word line, and the conductive layer in the element isolation region is a password line.

In the semiconductor device of the present embodiment, the thickness of the silicide layer 25S of the wiring layer WL-2 is greater than the thickness of the silicide layer 13S of the gate electrode WL-1. Since this structure reduces the resistance of the wiring layer WL-2, the so-called RC delay is reduced, and a high-speed operation can be expected.

Furthermore, since the wiring layer WL-2 has a reduced resistance, no metal wiring layer has to be provided as a liner layer. Accordingly, the word line WL can be as long as desired, and the memory cell MC can have a reduced cell area. In addition, defects due to a potential decrease in the word line WL can be decreased, and the manufacturing yield can be improved.

The width W1 of the gate electrode WL-1 is greater than the width W2 of the wiring layer WL-2.

This structure allows the gate electrode WL-1 to have a certain width W1, which is desired for attaining a reliable data retention characteristic. On the other hand, the width W2 of the wiring layer WL-2 is not increased. With this structure, the gate electrode made of the same layer as the wiring layer WL-2 can be electrically connected, and yet the cell area of the bit line BL, as viewed in the width direction, can be reduced. This structure is therefore advantageously used for realizing miniaturized devices.

A description will now be given as to how the semiconductor device of the above embodiment is manufactured, referring to FIGS. 3 through 11.

Referring to first to FIG. 3, a trench capacitor TC, a node insulating film 20, an electrode 21 and an element-isolating insulation film 22 are formed in a semiconductor substrate 11 in a known method.

Subsequently, the substrate 11 is heated, for example, by thermal oxidation, to form an $SiO_2$ film, and a gate insulation film 12 is formed in an element region AA. A polysilicon layer 33 is deposited on the gate insulation film 12 by chemical vapor deposition (CVD), for example.

Figure 4:
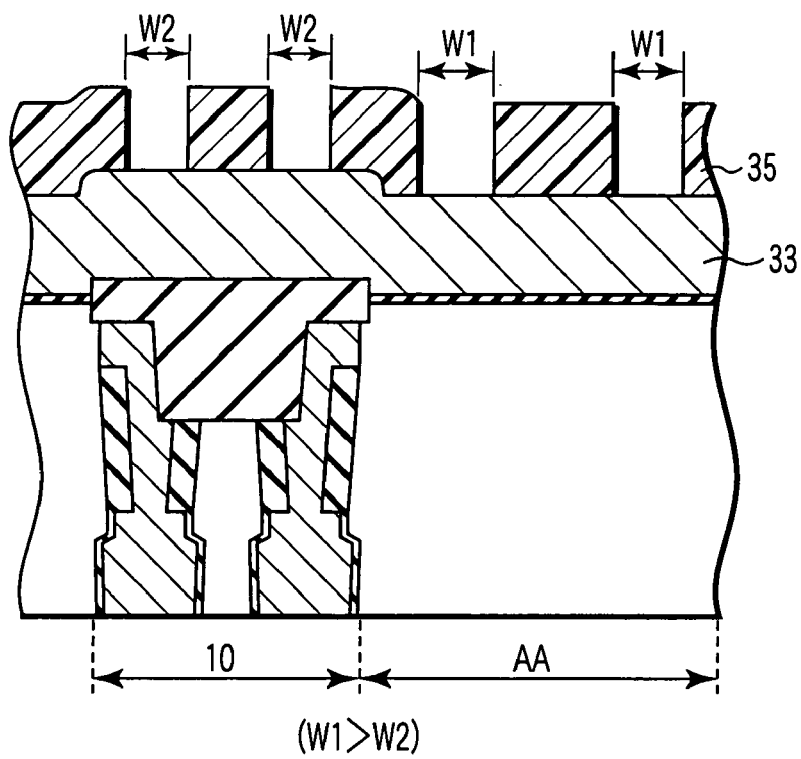
FIG. 4 is a sectional view illustrating a step performed in the semiconductor device manufacturing method related to the first embodiment.

As shown in FIG. 4, photoresist is coated over the polysilicon layer 33. By exposing the photoresist to light and developing it, a pattern wherein the width W1 in the element region AA is greater than the width W2 in the element isolation region 10 is transferred to the photoresist 35.

As shown in FIG. 5, anisotropic etching such as reactive ion etching (RIE) is performed by using the photoresist 35 (to which the pattern mentioned above is transferred) as a mask. By this anisotropic etching, the polysilicon layers 40-1 and 40-2 remain in the element region AA and the element isolation region 10. Polysilicon layers 40-1 and 40-2, thus formed, will be hereinafter referred to as polysilicon layers 13 and 25, respectively. Thereafter, the photoresist 35 is removed. Impurity ions, such as phosphor (P) ions or arsenic (As) ions, are doped into the substrate 11 by ion implantation, using the polysilicon layers 41-1 and 40-2 as a mask. The impurity ions are diffused in the substrate by annealing so that a source S and a drain D are formed in the semiconductor substrate.

As shown in FIG. 6, a tetraethylorthosilicate (TEOS) film 41 is deposited over the gate insulation film 12, polysilicon layer 13, polysilicon layer 25 and element-isolating insulation film 22 by CVD, for example.

As shown in FIG. 7, the TEOS film 41 is subjected to anisotropic etching such as RIE until the surface of the substrate 11 is exposed in the regions where the drain D is formed. By this etching, a spacer 14 is formed on the side wall of polysilicon layer 13 and on the side wall of polysilicon layer 25.

Figure 8:
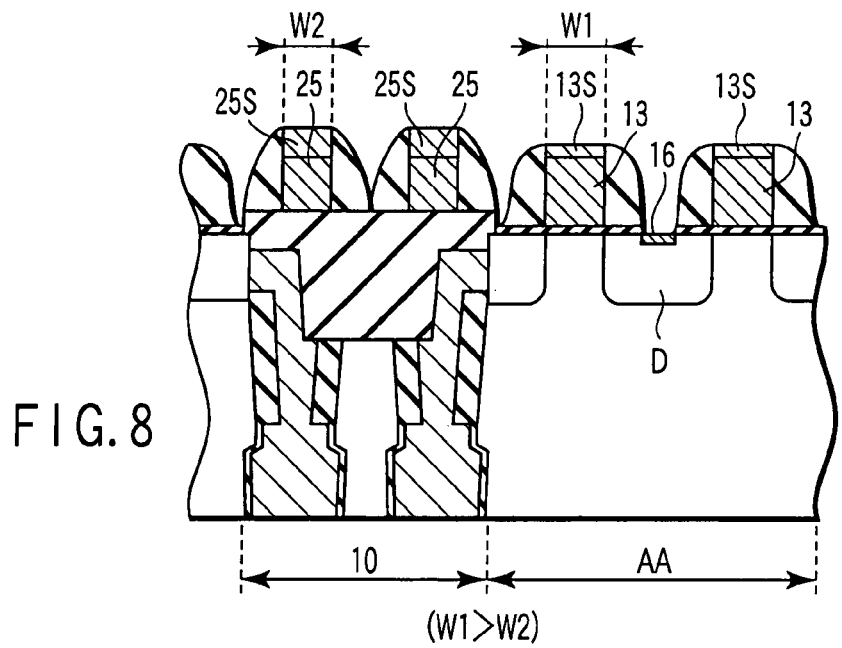
FIG. 8 is a sectional view illustrating a step performed in the semiconductor device manufacturing method related to the first embodiment.

Next, the salicide (self-aligned silicide) process is executed as shown in FIG. 8. In this process, the polysilicon layer 13 and 25 and the drain D are made to react with a high-melting point metallic layer, thereby forming silicide layers 13S, 25S and 16.

In the salicide process, the width W2 of the polysilicon layer 25 in the element isolation region 10 is less than the width W1 of the polysilicon layer 13 in the element region AA. Therefore, silicide layer 25S is formed to have a greater thickness than that of silicide layer 13S.

The steps subsequently required for forming the semiconductor device shown in FIGS. 1 and 2 are known in the art.

As described above, in the method for manufacturing the semiconductor device of the above embodiment, the width W2 of the polysilicon layer 25 in the element isolation region 10 is less than the width W1 of the polysilicon layer 13 in the element region AA (FIG. 4). Thereafter, the salicide process is carried out so that the polysilicon layers 13 and 25 can react with a high-melting point metallic layer, thereby forming silicide layers 13S and 25S (FIG. 8).

The thickness of the silicide layer 13S formed on the polysilicon layer 13 in the element region AA is thin, while the thickness of the silicide layer 25S formed on the polysilicon layer 25 in the element isolation region 10 is thick. Since the silicide layer 13S is thin, it is prevented from reacting with the gate insulation film 12. In addition, since the silicide layer 25S is thick, its resistance is low.

Anisotropic etching such as RIE is performed using the photoresist 35 (to which a pattern wherein the width W1 in the element region AA is greater than the width W2 in the element isolation region 10) as a mask. By this anisotropic etching, polysilicon layers 40-1 and 40-2 remain in the element region AA and element isolation region 10, respectively, thereby forming polysilicon layers 13 and 25. (FIGS. 3 and 4)

The polysilicon layers 13 and 25 having widths W1 and W2 can be formed simultaneously. Hence, the silicide layer 13S formed on the polysilicon layer 13 of large width W1 is thin, and the silicide layer 25S formed on the polysilicon layer 25 of small width W2 is thick. Furthermore, the width W1 of the polysilicon layer 13 in the element region AA and the width W2 of the polysilicon layer 25 in the element isolation layer 10 differ from each other. This structure is useful in providing the different-thickness silicide layers 13S and 25S, with no need to increase the manufacturing steps.

Second Embodiment

Trench-Type DRAM

A semiconductor device according to the second embodiment of the present invention will now be described, referring to FIG. 9. In the descriptions below, structural elements similar to those of the first embodiment will not be mentioned for the sake of simplicity.

Figure 9:
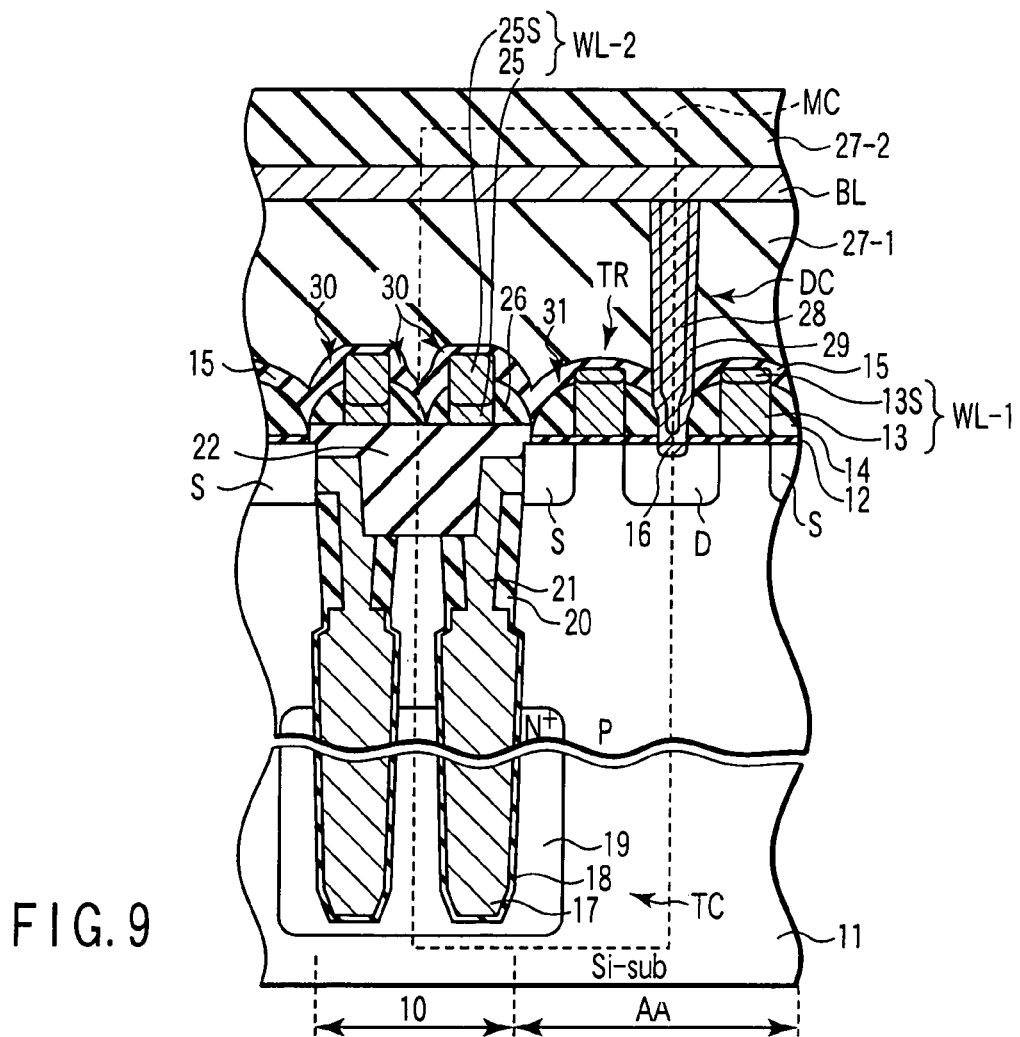
FIG. 9 is a sectional view illustrating a semiconductor device according to the second embodiment of the present invention, the plane of the sectional view in FIG. 9 being the same as that of the sectional view in FIG. 2.

FIG. 9 is a sectional view taken in the same direction as FIG. 2.

As shown in FIG. 9, the spacer 26 and the shoulder portion 30 of silicide layer 25S are exposed more than the spacer 14 and the shoulder portion 31 of silicide layer 13S. In other words, spacer 26 is located higher than spacer 14.

The silicide layer 25S of the wiring layer WL-2 is thicker than the silicide layer 13S of the gate electrode WL-1. The silicide layer 25S of the semiconductor device of the second embodiment is thicker than the silicide layer 25S of the semiconductor device of the first embodiment.

As described above, in the semiconductor device of the second embodiment, the silicide layer 25S of the wiring layer WL-2 is thicker than the silicide layer 13S of the gate electrode WL-1. Since the wiring layer WL-2 has a low resistance, the so-called RC delay is reduced, and a high-speed operation can be expected.

Furthermore, since the wiring layer WL-2 has a reduced resistance, no metal wiring layer has to be provided as a liner layer. Accordingly, the word line WL can be as long as desired, and the memory cell MC can have a reduced cell area. In addition, defects due to a potential decrease in the word line WL can be decreased, and the manufacturing yield can be improved.

A description will now be given as to how the semiconductor device of the second embodiment is manufactured, referring to FIGS. 10 through 15.

Figure 10:
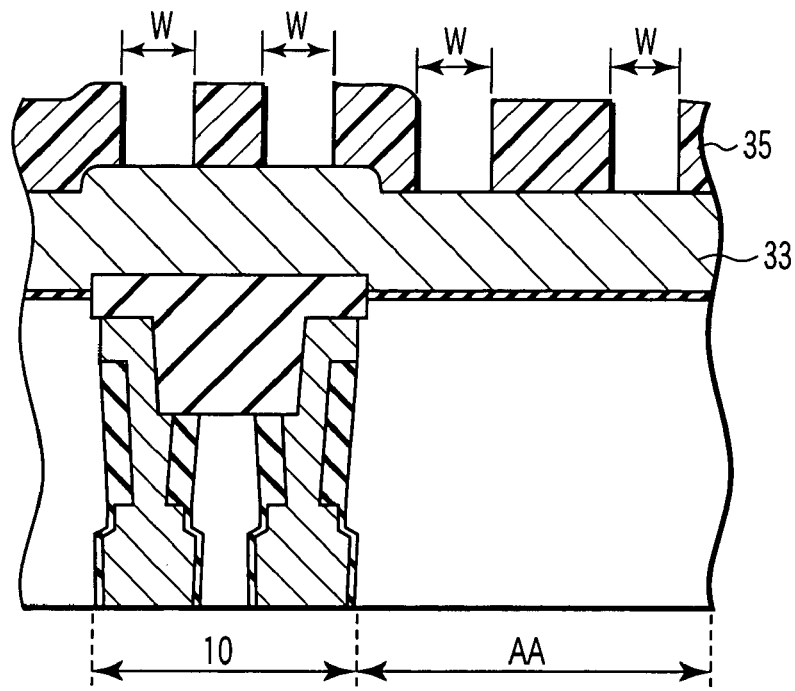
FIG. 10 is a sectional view illustrating a step performed in the semiconductor device manufacturing method related to the second embodiment.

As shown in FIG. 10, photoresist is coated over the polysilicon layer 33.

Subsequently, the photoresist is exposed to light and developed. By so doing, a pattern wherein the width W in the element region AA is equal to the width W in the element isolation region 10 is transferred to the photoresist 35.

Figure 11:
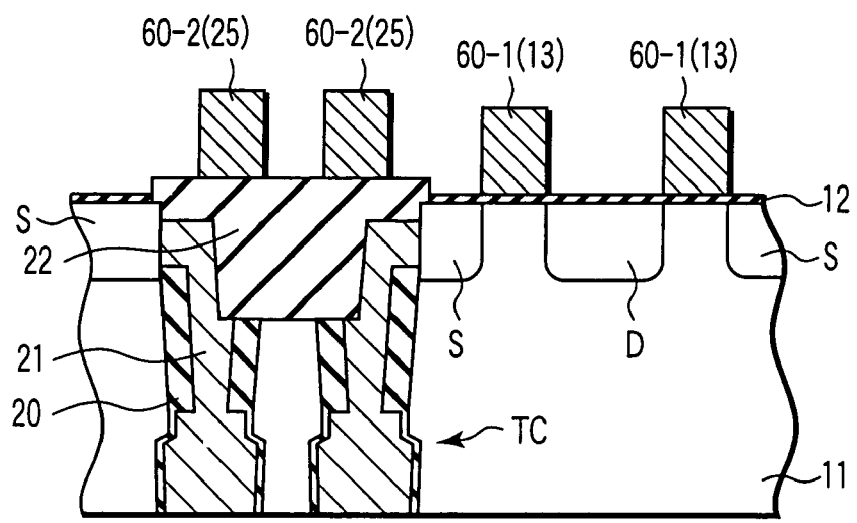
FIG. 11 is a sectional view illustrating a step performed in the semiconductor device manufacturing method related to the second embodiment.

As shown in FIG. 11, anisotropic etching such as reactive ion etching (RIE) is performed by using the photoresist 35 (to which the pattern mentioned above is transferred) as a mask. By this anisotropic etching, the polysilicon layers 60-1 and 60-2 remain in the element region AA and the element isolation region 10. Polysilicon layers 60-1 and 60-2, thus formed, will be hereinafter referred to as polysilicon layers 13 and 25, respectively. Thereafter, a source S and a drain D are formed in the semiconductor substrate 11, using similar steps to those of the first embodiment.

Figure 12:
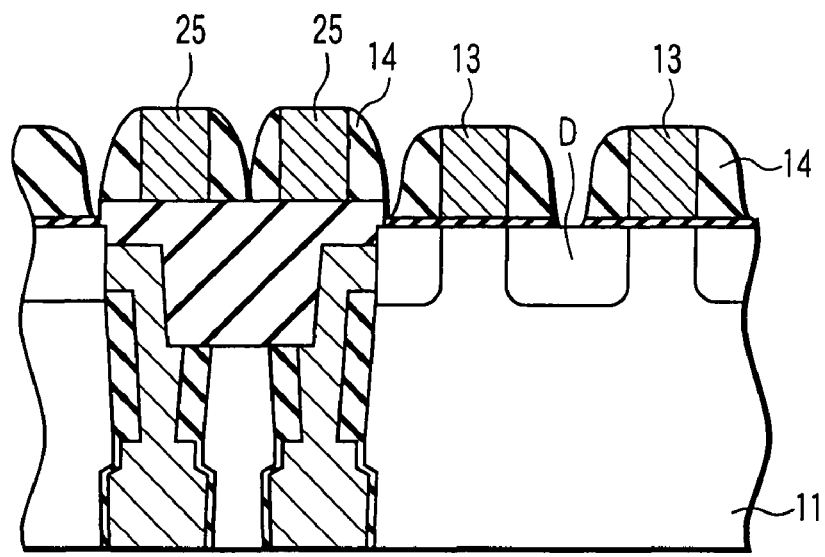
FIG. 12 is a sectional view illustrating a step performed in the semiconductor device manufacturing method related to the second embodiment.
Figure 13:
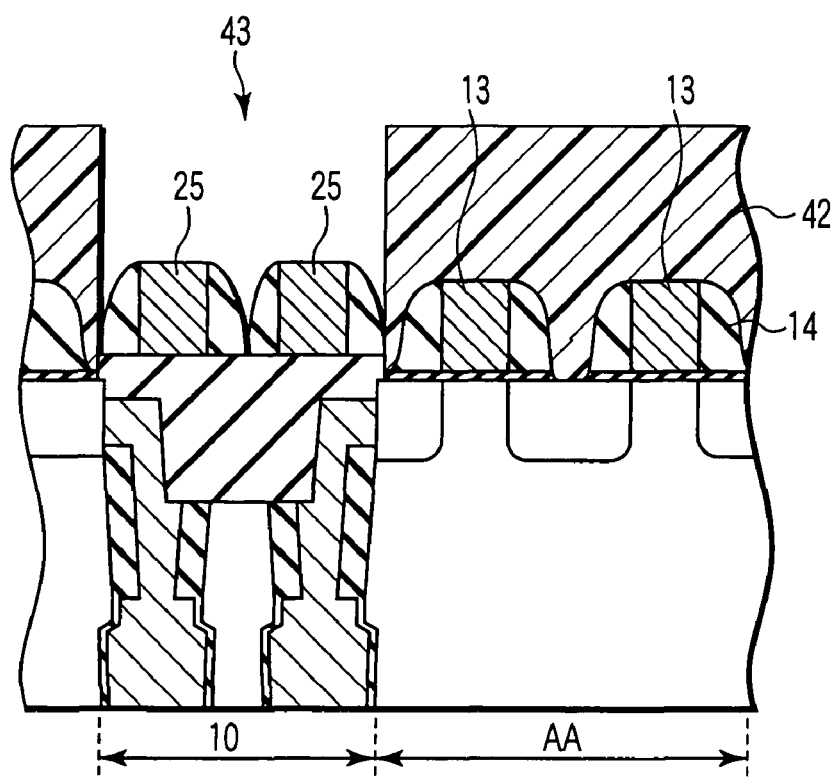
FIG. 13 is a sectional view illustrating a step performed in the semiconductor device manufacturing method related to the second embodiment.

As shown in FIG. 12, a spacer 14 is formed on the side wall of polysilicon layer 13 and on the side wall of polysilicon layer 25. The spacer 14 is formed using similar steps to those of the first embodiment.

Next, photoresist is coated over the polysilicon layer 13, the polysilicon layer 25 and the spacer 14. The photoresist is exposed to light and developed. By so doing, a pattern wherein the surface of the spacer 14 in the element isolation region 10 is exposed is transferred to the photoresist 42. The photoresist 42 has an opening 43 in which the surface of the spacer 14 formed on the side wall of the polysilicon layer 25 is exposed.

Figure 14:
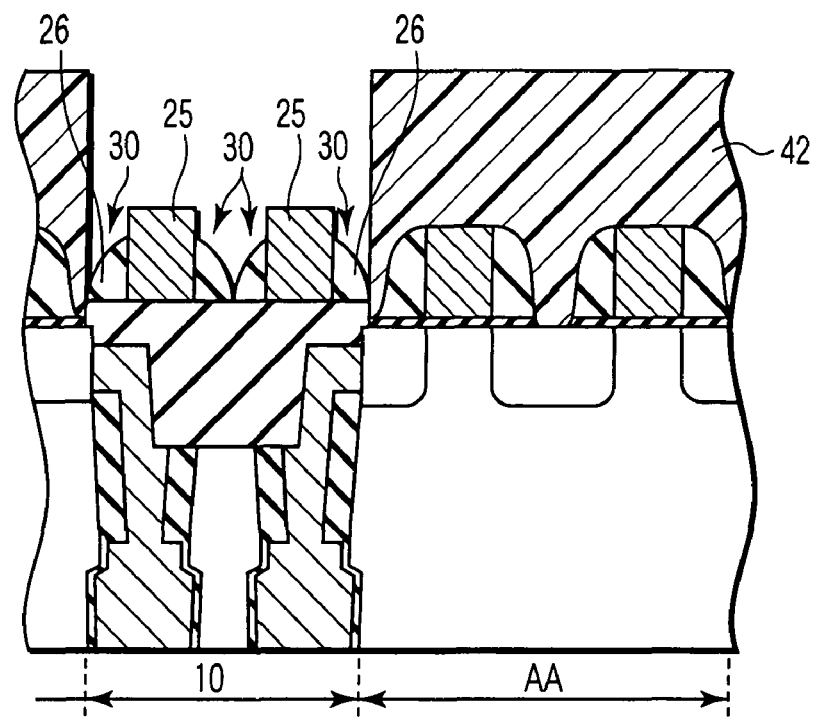
FIG. 14 is a sectional view illustrating a step performed in the semiconductor device manufacturing method related to the second embodiment.

As shown in FIG. 14, anisotropic etching such as RIE is performed by using the photoresist 42 as a mask. By this anisotropic etching, the spacer 14 in the element isolation region 10 is over-etched, thereby exposing the shoulder portion 30 of the polysilicon layer 25. The spacer 26 subject to the over etching is formed on the side wall of the polysilicon layer 25. Thereafter, the photoresist 42 is removed.

Figure 15:
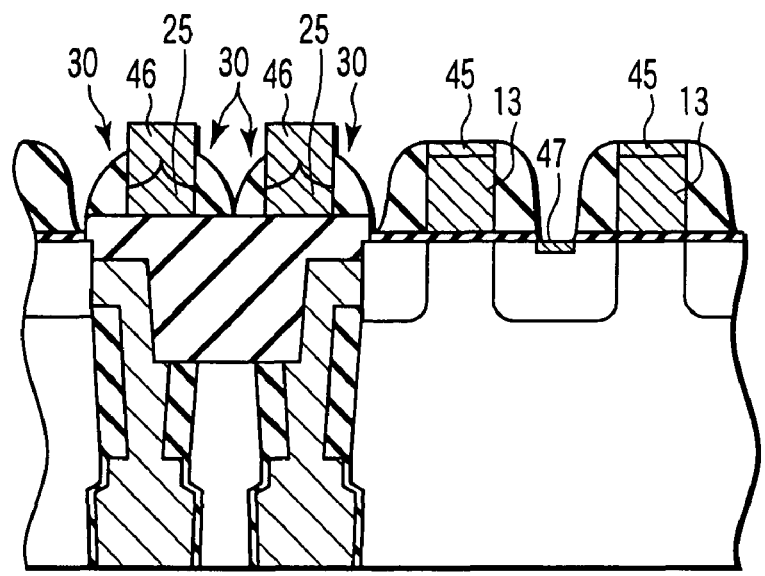
FIG. 15 is a sectional view illustrating a step performed in the semiconductor device manufacturing method related to the second embodiment.

As shown in FIG. 15, the salicide process is carried out so that the polysilicon layers 13 and 25 and the drain D can react with a high-melting point metallic layer, thereby forming silicide layers 45, 46 and 47. In this process, silicide layer 46 is grown from the over-etched shoulder portion 30 as well, so that the reaction is accelerated.

As shown in FIG. 16, the salicide process is continued so that the surfaces of the polysilicon layers 13 and 25 and the drain D react with the high-melting point metal layer. By this reaction, silicide layers 13S, 25S and 16 are formed, thus completing the formation of the gate electrode WL-1, wiring layer WL-2 and drain D.

The steps subsequently required for forming the semiconductor device shown in FIG. 9 are known in the art.

In the manufacturing method described above, the step for over-etching the spacer 26 of the element isolation region 10 to expose the shoulder portion 30 of the word line WL is not limited to RIE. The step may be carried out by wet etching, for example.

In the method for manufacturing the semiconductor device of the second embodiment, the spacer 14 in the element isolation region 10 is selectively over-etched to form a spacer 26, and the shoulder portion 30 of the word line WL is exposed (FIG. 14). Subsequently, the salicide process is carried out, in which a silicide layer 46 is grown from the over-etched shoulder portion 30 as well so as to accelerate the reaction (FIG. 15).

The silicide layer 25S of the wiring layer WL-2 in the element isolation region 10 can be selectively thickened by properly determining the reaction conditions of the salicide process or by properly determining the dimensions of the shoulder portion 30 exposed by over-etching. In this manner, the thickness of the silicide layer 25S can be controlled optimally.

Since the silicide layer 25S can be selectively thickened, the gate insulation film 12 of the element region AA is prevented from reacting with the silicide layer 13S. Since the silicide layer 13S does not penetrate the gate insulation film 12, reliability is ensured.

Since the silicide layer 25S can be selectively thickened, the resistance of the wiring layer WL-2 can be lowered. As a result, the RC delay can be reduced, and a high-speed operation can be expected.

Since the wiring layer WL-2 has a reduced resistance, the word line WL can be as long as desired, and the memory cell MC can have a reduced cell area. In addition, defects due to a potential decrease in the word line WL can be decreased, and the manufacturing yield can be improved.

Since the spacer of the polysilicon layer 13 is not over-etched, the silicide layer 13S can be selectively thinned. In this manner, the thickness of the silicide layer 25S can be controlled optimally.

In the second embodiment, a pattern wherein the width W in the element region AA is equal to the width W in the element isolation region 10 is transferred to the photoresist 35. Anisotropic etching such as RIE is performed, using the photoresist 35 as a mask, and polysilicon layers 60-1 and 60-2 are permitted to remain in the element region AA and the element isolation region 10, respectively. As a result, polysilicon layers 13 and 25 are formed in those regions (FIGS. 10 and 11).

The pattern transferred to the photoresist 35 is a so-called line and space pattern wherein the width W is substantially constant. The use of this pattern advantageously reduces the manufacturing cost.

Third Embodiment

Logic Circuit

A semiconductor device according to the third embodiment of the present invention will now be described, referring to FIGS. 17 and 18. In the descriptions below, structural elements similar to those of the first and second embodiments will not be mentioned for the sake of simplicity. The third embodiment will be described, referring to a logic circuit having a polycide wiring structure.

FIG. 17 is a plan view schematically illustrating a semiconductor device according to the third embodiment of the present invention. FIG. 18 is a sectional view taken along line 18-18 of FIG. 17.

Figure 18:
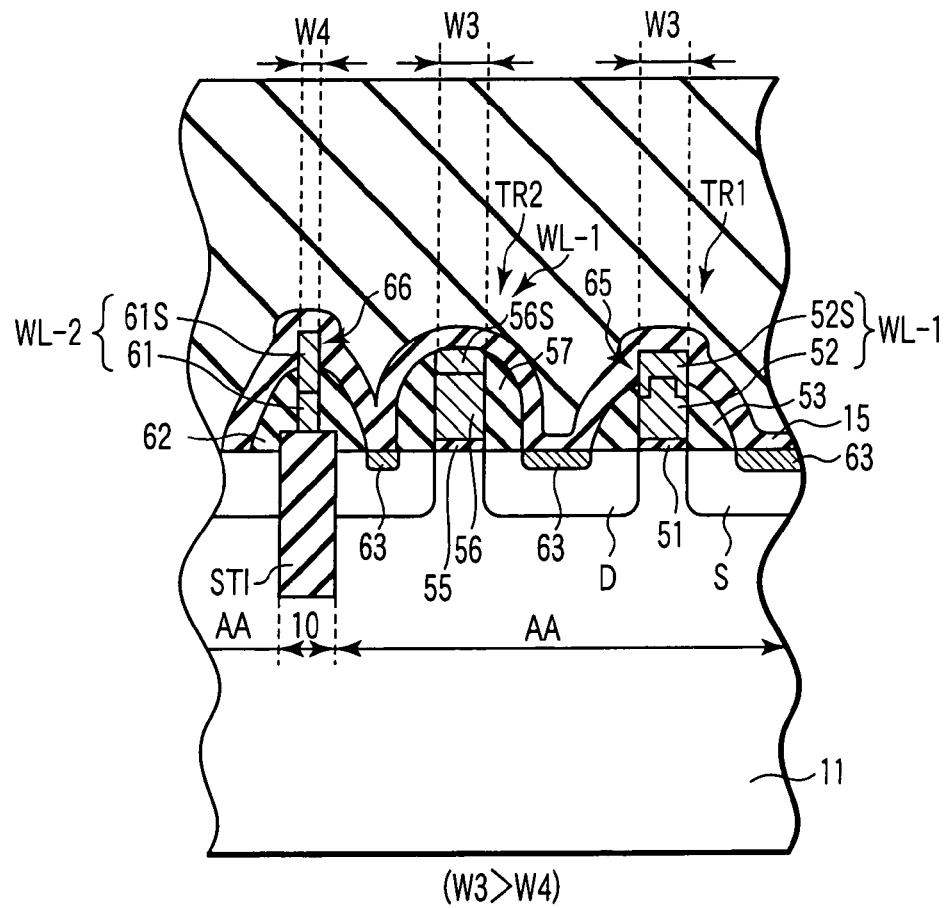
FIG. 18 is a sectional view taking along line 18-18 of FIG. 17.

As shown in FIG. 18, transistors TR1 and TR2 are provided in an element region AA on the major surface of the semiconductor substrate 11. A wiring layer WL-2 is provided in an element isolation region 10, which is realized by shallow trench isolation (STI).

Transistor TR1 includes: a polysilicon layer 52 provided on a gate insulating film 51; a silicide layer 52S provided on the polysilicon layer 52; a spacer 53 formed on the side walls of the polysilicon layer 52 and the silicide layer 52S; and a source S and a drain D separately formed in the semiconductor substrate 11 in such a manner as to sandwich the polysilicon layer 52. The polysilicon layer 52 and the silicide layer 52S form a gate electrode WL-1 of transistor TR1.

Likewise, transistor TR2 includes: a polysilicon layer 56 provided on a gate insulating film 55; a silicide layer 56S provided on the polysilicon layer 56; a spacer 57 formed on the side walls of the polysilicon layer 56 and the silicide layer 56S; and a source S and a drain D separately formed in the semiconductor substrate 11 in such a manner as to sandwich the polysilicon layer 56. A silicide layer 63 is formed on each of the source S and drain D of transistor TR1 and on each of the source S and drain D of transistor TR2. The polysilicon layer 56 and the silicide layer 56S form a gate electrode WL-1 of transistor TR2.

A wiring layer WL-2 includes: a polysilicon layer 61 formed above the STI; a silicide layer 61S provided on the polysilicon layer 61; and a spacer 62 formed on the side walls of the polysilicon layer 61 and the silicide layer 61S.

A liner insulation film 15 is formed over transistor TR1, transistor TR2 and the wiring layer 15.

The width W3 of the gate electrodes WL-1 of transistors TR1 and TR2 is greater than the width W4 of the wiring layer WL-2. The silicide layer 52S has thick portions at positions corresponding to the shoulder portions of transistor TR1.

The thickness of the silicide layer 61S of the wiring layer WL-2 is greater than those of the silicide layers 52S and 56S of transistors TR1 and TR2.

The shoulder portions 65 of transistor TR1 (i.e., the portions in the neighborhood of the spacer 53 and the silicide layer 52S) are exposed, and the silicide layer 52S is projected more than the spacer 52. Likewise, the shoulder portions 66 of the wiring layer WL-2 (i.e., the portions in the neighborhood of the spacer 62 and the silicide layer 61S) are exposed, and the silicide layer 61S is projected more than the spacer 62.

The above-mentioned structure of the third embodiment produces advantages similar to those of the first and second embodiments. Since the silicide layer 61S of the wiring layer WL-2 is thick, the resistance of the wiring layer WL-2 can be lowered. As a result, the RC delay can be reduced, and a high-speed operation can be expected.

In addition, the silicide layer 52S is thick at positions corresponding to the shoulder portions 65 of transistor TR1. Therefore, not only the resistance of the wiring layer WL-2 in the element isolation region 10 but also the resistance of the gate electrode WL-1 can be reduced partially or selectively. As a result, the RC delay can be reduced, and a higher-speed operation can be expected.

A method for manufacturing the semiconductor device of the third embodiment will now be described, referring to FIGS. 19 through 24.

Figure 19:
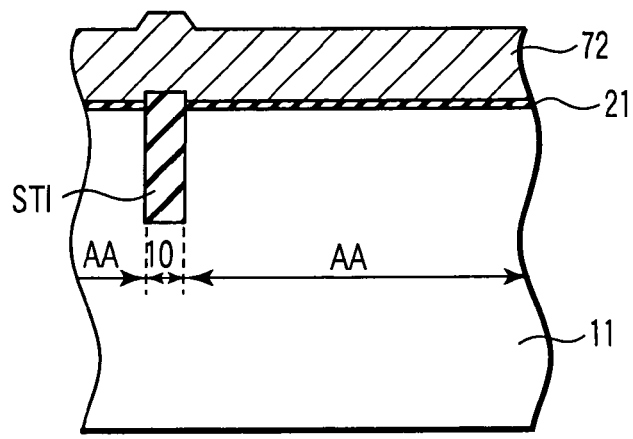
FIG. 19 is a sectional view illustrating a step performed in a semiconductor device manufacturing method related to the third embodiment.

As shown in FIG. 19, an STI is formed in the major surface of a semiconductor substrate 11 by executing known manufacturing steps. As a result, an element region AA and an element isolation region 10 are defined. The substrate 11 is heated by thermal oxidation, for example, so as to form an $SiO_2$ film 21 on the substrate 11. A polysilicon layer 72 is formed on the $SiO_2$ film 21 by CVD, for example.

As shown in FIG. 20, the $SiO_2$ film 21 is coated with photoresist. The photoresist is exposed to light and developed. By this process, the photoresist 73 is patterned in such a manner that width W3 in the element region AA is greater than width W4 in the element isolation region 10.

As shown in FIG. 21, anisotropic etching such as RIE is performed using the photoresist 73 as a mask. By this anisotropic etching, trenches extending to the surface of the substrate 11 are formed. Polysilicon layers 52, 56 and 61 and gate insulation films 51 and 55 are formed inside the trenches. After the photoresist 73 is removed, impurity ions (phosphor ions or arsenic ions) having the opposite conductivity to that of the substrate 11 are doped into the substrate 11 by ion implantation, for example. The polysilicon layers 52 and 56 are used as a mask during the ion implantation. The impurity ions are diffused in the substrate 11 by annealing, thereby forming a source S and a drain D. Then, a TEOS film is formed on the substrate 11 and the polysilicon layers 52, 56 and 61 by CVD, for example. The TEOS film is subject to anisotropic etching, such as RIE, until the surface of the substrate 11 is exposed. By this anisotropic etching, spacers 72 are formed on the side walls of the polysilicon layers 52, 56 and 61.

In addition, photoresist is coated over the polysilicon layers 52, 56 and 61 and the spacers 74. The photoresist is exposed to light and developed, thereby forming photoresist 75. The photoresist 75 has a pattern wherein transistor TR2 is covered and the surfaces of transistor TR1 and the wiring layer WL-2 are selectively exposed. To be more specific, the photoresist 75 has an opening section 70 in which the surfaces of transistor TR1 and wiring layer WL-2 are exposed.

As shown in FIG. 22, anisotropic etching such as RIE is performed using the photoresist 75 as a mask. By this anisotropic etching, the spacer 74 of transistor TR1 and the spacer 74 of the wiring layer WL-2 are over-etched. Thus, the shoulder portions 65 and 66 are exposed, and spacers 53 and 62 are formed.

As shown in FIG. 23, the salicide process is carried out so that the polysilicon layers 52, 56 and 61, the source S and the drain D can react with a high-melting point metallic layer, thereby forming silicide layers 77. In this process, silicide layers 77 on the polysilicon layers 52 and 61 are grown from the over-etched shoulder portions 65 and 66 as well, so that the reaction is accelerated.

As shown in FIG. 24, the salicide process is continued so that the gate electrode 52, the polysilicon layers 57, the source S and the drain D further react with the high-melting point metallic layer. As a result, the silicide layers 52S, 56S and 61S are formed, and gate electrodes WL-1 and wiring layers WL-2 of transistors TR1 and TR2 are formed.

The steps subsequently required for forming the semiconductor device shown in FIGS. 17 and 18 are known in the art.

In the manufacturing method described above, the step for over-etching the spacer 74 of the wiring layer WL-2 and the spacer 74 of transistor TR1 (by which step, the shoulder portions 65 and 66 are exposed and spacers 53 and 62 are formed) is not limited to RIE. The step may be carried out by wet etching, for example.

In the salicide process described above, when the silicide layer 77 is formed by the reaction between the polysilicon layer 56 and the high-melting point metallic layer, the silicide layer 77 is grown from the shoulder portion 65 as well, and the gate electrode 52 is therefore thick. If the reaction is further accelerated by properly determining the reaction conditions of the salicide process, not only the film portion corresponding to the shoulder portion 65 but also the other film portions can be thickened, as in the case of the silicide layer 61S of the wiring layer. Likewise, the silicide layer 56S of transistor TR1 can be thickened not only at positions corresponding to the shoulder portion but also at the other positions.

The above-mentioned manufacturing method of the third embodiment produces advantages similar to those of the first and second embodiments. The photoresist 75 formed in the manufacturing method of the third embodiment has a pattern wherein the transistor TR2 is covered with the photoresist 75 and the surfaces of transistor TR1 and wiring layer WL-2 are selectively exposed (FIG. 21). Using the photoresist 75 as a mask, anisotropic etching such as RIE is performed, so as to over-etch the space 74 of wiring layer WL-2 and the spacer 75 of transistor TR1. By this over-etching, the shoulder portions 65 and 66 are exposed, and the spacers 53 and 62 are formed (FIG. 22).

Since the salicide process is subsequently performed, the silicide layer 77 is grown from the over-etched shoulder portions 65 and 66, thus accelerating the reaction. As a result, the silicide layer 61S on the polysilicon layer 61 is thick, and the silicide layer 52S is also thick at positions corresponding to the shoulder portion 65 (FIGS. 23 and 24).

As described above, the silicide layer 61S of the wiring layer WL-2 can be thickened, and in addition, the silicide layer 52S can be selectively thickened at positions corresponding to the shoulder portion 65 of transistor TR1. Furthermore, the silicide layer 61S and the selected portions of the silicide layer 52S can be thickened simultaneously. Therefore, the resistance of the gate electrode WL-1 of transistor TR1 can be reduced without an increase in the manufacturing cost. As a result, the RC delay can be reduced, and a higher-speed operation can be expected.

The silicide layer 52S can be selectively thickened at positions corresponding to the shoulder portions 65 of transistor TR1 by properly determining the reaction conditions. Therefore, the silicide layer 52S can be provided with an optimal resistance, the reliability is increased.

As shown in FIG. 25, the polysilicon layer 61 on the element-isolating insulation film STI may be entirely silicided (so-called "fully siliciding"). Where this structure is used, the area of the silicide layer is increased, and the silicide layer has a further reduced resistance. Since no gate insulation film is formed under the polysilicon layers 25 and 61, the silicide layer 61S (which is a fully silicided one) is prevented from reacting with the gate insulation film. The silicide layer does not penetrate the gate insulation film, and no current leaks to the substrate 11.

How the spacer 74 of the wiring layer WL-2 is over-etched or how the shoulder portion 66 is exposed can be controlled by properly determining the reaction conditions. For example, the anisotropic etching (such as RIE) shown in FIG. 22 may be executed for a long period of time, or the application voltage can be increased.

In the salicide process shown in FIG. 23, the silicide layer on the over-etched shoulder portion 66 may be grown for a long time. By lengthening the reaction time in this manner, the entire polysilicon layer 61 can be silicided, thereby forming the silicide layer 61S.

Layers 13, 25, 53, 56 and 61 described above need not be polysilicon; they may be amorphous silicon.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device manufacturing method comprising:
    forming element-isolating insulation films in element isolation regions of a semiconductor substrate;
    continuously forming a polysilicon layer on the semiconductor substrate such that the polysilicon layer is formed on the element-isolating insulation films and on an element region surrounded by the element-isolating insulation films;
    introducing impurities into the element region of the semiconductor substrate, using the polysilicon layer as a mask;
    forming a spacer which is in contact with a side wall of the polysilicon layer;
    forming a mask layer having an opening in which the spacer in each of the element isolation regions is exposed;
    etching the spacer, using the mask layer as a mask, such that shoulder portions which are near the spacer in each of the element isolation regions and the polysilicon layer in each of the element isolation regions are exposed, each exposed area includes the polysilicon layer, the shoulder portions, and the element isolation regions;
    forming a silicide layer on the polysilicon layer by a salicide process and permitting a silicide layer to grow on the exposed shoulder portions of the polysilicon layer such that the silicide layer is thicker in each element isolation region than in the element region, the silicide layer having thick film in the element isolation region is connected with that having thin film in the element region in a plane.

2. The method according to claim 1, wherein the polysilicon layer is continuously formed such that the polysilicon layer has a greater width in the element region than in the element isolation regions.

3. The method according to claim 1, further comprising:
    forming a trench capacitor in the semiconductor substrate before forming the element-isolating insulation films.

* * * * *